(12) United States Patent
Agranov et al.

(10) Patent No.: US 7,576,361 B2
(45) Date of Patent: Aug. 18, 2009

(54) BACKSIDE SILICON WAFER DESIGN REDUCING IMAGE ARTIFACTS FROM INFRARED RADIATION

(75) Inventors: Gennadiy A. Agranov, Boise, ID (US); Igor Karasev, San Jose, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 350 days.

(21) Appl. No.: 11/195,687

(22) Filed: Aug. 3, 2005

(65) Prior Publication Data

US 2007/0031988 A1  Feb. 8, 2007

(51) Int. Cl.
*H01L 29/76* (2006.01)
(52) U.S. Cl. .............................. 257/66; 257/72; 257/75
(58) Field of Classification Search .................. 438/60, 438/65, 66, 72, 75
See application file for complete search history.

(56) References Cited

U.S. PATENT DOCUMENTS

| | | | |
|---|---|---|---|
| 3,971,065 A | 7/1976 | Bayer | |
| 4,365,259 A | 12/1982 | Schroder | |
| 4,789,648 A | 12/1988 | Chow et al. | |
| 4,956,313 A | 9/1990 | Cote et al. | |
| 5,137,544 A | 8/1992 | Medellin | |
| 5,157,876 A | 10/1992 | Medellin | |
| 5,209,816 A | 5/1993 | Yu et al. | |
| 5,244,523 A | 9/1993 | Tollini | |
| 5,340,370 A | 8/1994 | Cadien et al. | |
| 5,354,490 A | 10/1994 | Yu et al. | |
| 5,391,258 A | 2/1995 | Brancaleoni et al. | |
| 5,471,515 A | 11/1995 | Fossum et al. | |
| 5,476,606 A | 12/1995 | Brancaleoni et al. | |
| 5,527,423 A | 6/1996 | Neville et al. | |
| 5,783,489 A | 7/1998 | Kaufman et al. | |
| 5,942,771 A | 8/1999 | Ishimura | |
| 5,954,997 A | 9/1999 | Kaufman et al. | |
| 5,993,686 A | 11/1999 | Streinz et al. | |
| 6,015,506 A | 1/2000 | Streinz et al. | |
| 6,033,596 A | 3/2000 | Kaufman et al. | |
| 6,039,891 A | 3/2000 | Kaufman et al. | |
| 6,063,306 A | 5/2000 | Kaufman et al. | |
| 6,068,787 A | 5/2000 | Grumbine et al. | |
| 6,121,143 A | 9/2000 | Messner et al. | |
| 6,175,442 B1 * | 1/2001 | Booth et al. | 359/290 |
| 6,333,205 B1 | 12/2001 | Rhodes | |
| 6,376,868 B1 | 4/2002 | Rhodes | |
| 6,420,691 B1 * | 7/2002 | Loh et al. | 250/208.1 |
| 6,444,588 B1 | 9/2002 | Holscher et al. | |

(Continued)

FOREIGN PATENT DOCUMENTS

EP 0 186 044 A2 7/1986

(Continued)

OTHER PUBLICATIONS

Partial International Search Report dated Jul. 10, 2007.

*Primary Examiner*—Kevin M Picardat
(74) *Attorney, Agent, or Firm*—Dickstein Shapiro LLP

(57) ABSTRACT

Imaging devices having reduced image artifacts are disclosed. The image artifacts in the imaging devices are reduced by redirecting, absorbing or scattering IR radiation that passes through the imaging device substrate away from dark pixels.

12 Claims, 11 Drawing Sheets
(1 of 11 Drawing Sheet(s) Filed in Color)

U.S. PATENT DOCUMENTS

| | | |
|---|---|---|
| 6,614,085 B2 | 9/2003 | Hu |
| 6,713,404 B2 | 3/2004 | Hishiro |
| 6,753,584 B1 | 6/2004 | Hu |
| 6,767,689 B2 | 7/2004 | Pavelchek et al. |
| 6,783,900 B2 | 8/2004 | Venkataraman |
| 6,869,747 B2 | 3/2005 | Sabnis et al. |
| 6,887,648 B2 | 5/2005 | Pavelchek et al. |
| 2001/0012067 A1* | 8/2001 | Spitzer et al. ............... 348/243 |
| 2002/0158294 A1 | 10/2002 | Fujiwara et al. |
| 2004/0004254 A1 | 1/2004 | Watanabe |
| 2005/0134769 A1* | 6/2005 | Mi ............................. 349/114 |

FOREIGN PATENT DOCUMENTS

| | | |
|---|---|---|
| EP | 0 608 932 A | 8/1994 |
| JP | 63-161667 A1 | 7/1988 |
| JP | 02-094566 A1 | 4/1990 |

* cited by examiner

US 7,576,361 B2

1

BACKSIDE SILICON WAFER DESIGN REDUCING IMAGE ARTIFACTS FROM INFRARED RADIATION

BACKGROUND OF THE INVENTION

The semiconductor industry currently uses different types of semiconductor-based imagers, such as charge coupled devices (CCDs), complementary metal oxide semiconductor (CMOS) devices, photodiode arrays, charge injection devices and hybrid focal plane arrays, among others.

Solid-state image sensors, also known as imagers, were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including CCDs, photodiode arrays, charge injection devices (CIDs), hybrid focal plane arrays, and CMOS imagers. Current applications of solid-state imagers include cameras, scanners, machine vision systems, vehicle navigation systems, video telephones, computer input devices, surveillance systems, auto focus systems, star trackers, motion detector systems, image stabilization systems and other image based systems.

These imagers typically consist of an array of pixel cells containing photosensors, where each pixel cell produces a signal corresponding to the intensity of light impinging on that element when an image is focused on the array. These signals may then be used, for example, to display a corresponding image on a monitor or otherwise used to provide information about the optical image. The photosensors are typically photogates, phototransistors, photoconductors or photodiodes, where the conductivity of the photosensor or the charge stored in a diffusion region corresponds to the intensity of light impinging on the photosensor. The magnitude of the signal produced by each pixel cell, therefore, is proportional to the amount of light impinging on the photosensor.

Active pixel sensor (APS) imaging devices are described, for example, in U.S. Pat. No. 5,471,515, which is herein incorporated by reference. These imaging devices include an array of pixel cells, arranged in rows and columns, that convert light energy into electric signals. Each pixel includes a photodetector and one or more active transistors. The transistors typically provide amplification, read-out control and reset control, in addition to producing the electric signal output from the cell.

While CCD technology has a widespread use, CMOS imagers are being increasingly used as low cost imaging devices. A fully compatible CMOS sensor technology enabling a higher level of integration of an image array with associated processing circuits would be beneficial to many digital imager applications.

A CMOS imager circuit includes a focal plane array of pixel cells, each one of the cells including a photoconversion device, for example, a photogate, photoconductor, phototransistor, or a photodiode for accumulating photo-generated charge in a portion of the substrate. A readout circuit is connected to each pixel cell and includes at least an output transistor, which receives photogenerated charges from a doped diffusion region and produces an output signal which is periodically read out through a pixel access transistor. The imager may optionally include a transistor for transferring charge from the photoconversion device to the diffusion region or the diffusion region may be directly connected to or be part of the photoconversion device. A transistor is also typically provided for resetting the diffusion region to a predetermined charge level before it receives the photoconverted charges.

In a CMOS imager, the active elements of a pixel cell perform the necessary functions of: (1) photon to charge conversion; (2) accumulation of image charge; (3) transfer of charge to a floating diffusion region accompanied by charge amplification; (4) resetting the floating diffusion region to a known state; (5) selection of a pixel cell for readout; and (6) output and amplification of a signal representing the pixel cell charge. Photo-charge may be amplified when it moves from the initial charge accumulation region to the floating diffusion region. The charge at the floating diffusion region is typically converted to a pixel output voltage by a source follower output transistor.

Each pixel cell receives light focused through one or more micro-lenses. Micro-lenses on a CMOS imager help increase optical efficiency and reduce cross talk between pixel cells. A reduction of the size of the pixel cells allows for a greater number of pixel cells to be arranged in a specific pixel cell array, thereby increasing the resolution of the array. In one process for forming micro-lenses, the radius of each micro-lens is correlated to the size of the pixel cell. Thus, as the pixel cells decrease in size, the radius of each micro-lens also decreases.

The micro-lenses refract incident radiation to the photosensor region, thereby increasing the amount of light reaching the photosensor. Other uses of micro-lens arrays include intensifying illuminating light on the pixel cells of a non-luminescent display device such as a liquid crystal display device to increase the brightness of the display, display associated with a camera, forming an image to be printed in a liquid crystal or light emitting diode printer, and as focusing means for coupling a luminescent device or a receptive device to an optical fiber.

One problem with image devices are the creation of artifacts. Penetration of infrared (IR) radiation to the substrate may create artifacts in the image sensors. Modern image devices usually use so called "dark pixels" that are shielded from incident light and serve as reference pixels for black level calibration, dark current subtraction, and row wise noise correction. IR radiation in the spectral range of from about 800 nm to about 1150 nm, with a very small absorption in the substrate, can penetrate through the entire substrate, be reflected from the backside of the wafer (as well as from the reflectance surface under the die), and hit the "dark pixels." The absorption of reflected IR radiation by dark pixels can create image artifacts in the modern image devices, despite the fact that the absorption itself is very small in this spectral range. Because of the small number of dark pixels used to calculate the reference signal, usually the dark reference signal is calculated from averaging of 32 or 64 dark pixels, a small change in signals from dark pixels can create large image artifacts. Reflected IR radiation or IR radiation penetrating through the backside of the wafer can create general image artifacts as well.

Reference is made to FIG. 1, which schematically illustrates a solid state imager 10 of the prior art and illustrates the problem of accumulation of reflected IR radiation in the dark pixels. The imager 10 includes active pixels 12 and dark pixels 11. IR radiation 101 is focused through a mirco-lens 13 to the active pixel 12. Some of the radiation 101 passes through the substrate 18 and is reflected from the backside of the substrate 18 as reflected radiation 103 and accumulates in the dark pixel 11. As noted above, the absorption of reflected IR radiation by dark pixels 11 can create image artifacts in the modem image devices, despite the fact that the absorption itself is very small in this spectral range.

The problem of reflected IR radiation in the 800 nm to 1150 nm range is increased for thinner background wafers due to the smaller total optical path of IR radiation hitting dark pixels. Thus, more IR radiation with shorter wavelengths can reach "dark pixels" due to reflection from backside of the substrate when the substrate is thinner.

The present invention discloses a substrate that substantially reduces image artifacts from IR radiation penetrating into the substrates in an image sensor. The present invention improves image quality at extreme light conditions, significantly reduces image artifacts due to interaction of reflected IR light with dark pixels, and allows the use of imaging devices with thinner substrates.

BRIEF SUMMARY OF THE INVENTION

The present invention provides imaging devices having reduced image artifacts by significantly reducing or redirecting IR radiation penetrating into the imager substrate and therefore reducing IR contact with dark pixels. In particular, the invention is applicable for any micro-electronic or micro-optical device that requires high quality micro-lenses such as, for example, CCD imagers and CMOS imagers.

The present invention provides a method for reducing image artifacts in a solid state imager having a pixel cell array, wherein the image artifacts are reduced by significantly reducing or redirecting IR radiation penetrating into the imager substrate. The present invention also reduces image artifacts in a solid state imager by significantly reducing or redirecting IR radiation from penetrating into the backside of the substrate. In one embodiment of the invention, the IR radiation is significantly reduced or redirected by applying an antireflective coating and/or an absorption layer to the backside of the imager substrate.

In another embodiment of the invention, the IR radiation is significantly reduced or redirected by modifying the backside surface of the imager substrate.

In another embodiment of the invention, the IR radiation is significantly reduced or redirected by modifying the spacing of the active pixels and the dark pixels in the imager. Also provided are methods for forming the imaging devices of the present invention having reduced image artifacts.

Additional advantages and features of the present invention will be apparent from the following detailed description and drawings which illustrate preferred embodiments of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate" are to be understood as including silicon, silicon-on-insulator (SOI) or silicon-onsapphire (SOS) technology, doped and undoped semiconductors, epitaxial layers of silicon supported by a base semiconductor foundation, and other semiconductor structures. Furthermore, when reference is made to a "wafer" and "substrate" in the following description, previous process steps may have been utilized to form regions or junctions in the base semiconductor structure or foundation. In addition, the semiconductor need not be silicon-based, but could be based on silicon-germanium, germanium, gallium arsenide, or other semiconductor material.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

Finally, while the invention is described with reference to a CMOS imager, it should be appreciated that the invention may be applied in any micro-electronic or micro-optical device that requires high quality micro-lenses for optimized performance. Other suitable micro-optical devices include CCDs and displays.

Figure 1:
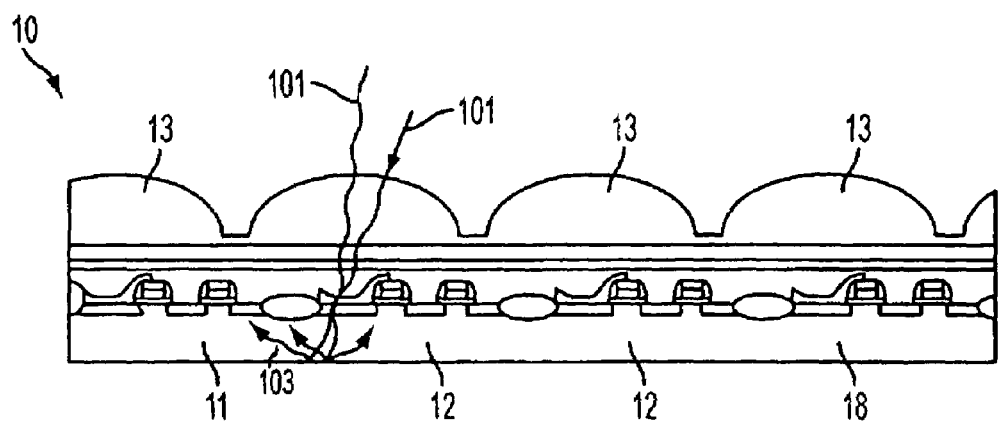
FIG. 1 is a side cross-sectional view illustrating a solid-state imager of the prior art.
Figure 2:
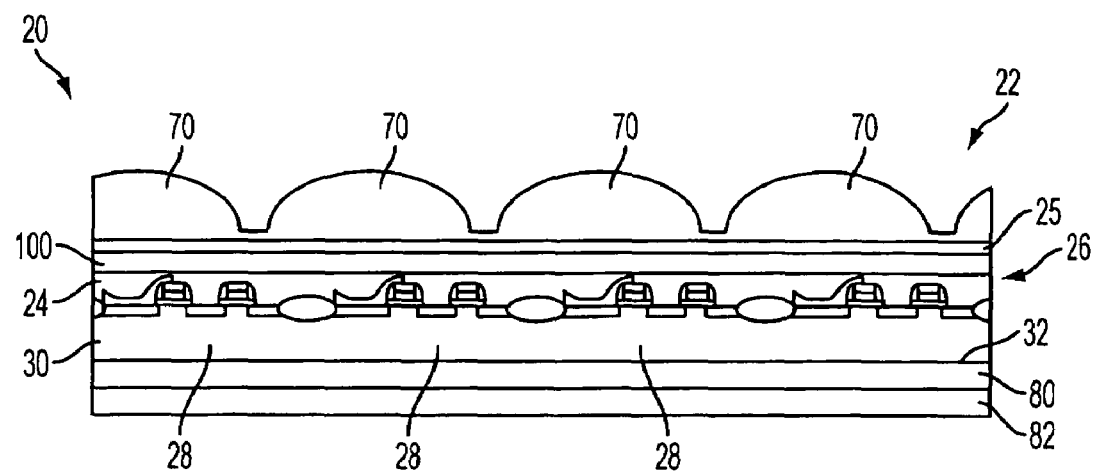
FIG. 2 is a side cross-sectional view illustrating the principal elements of a solid-state imager having an antireflective layer and an absorption layer on the backside of the substrate in accordance with an exemplary embodiment of the present invention.

Referring now to the drawings, where like elements are designated by like reference numerals. Reference is now made to FIG. 2, which schematically shows a solid-state imager 20 according to a first embodiment of the present invention. The imager 20 comprises a color filter layer 100 and a spacer layer 25 formed over a pixel cell array 26 as part of the same substrate 30, which may be any of the types of substrate described above. A micro-lens array 70 is formed over the color filter layer 100 and spacer layer 25. The pixel cell array 26 comprises a plurality of pixel sensor cells 28 formed in and over a first surface of the substrate 30, and is covered by a protective layer 24 which includes a passivation and planarization layer for the imager 20 as well as various metalization layers for connections. The passivation layer included in protective layer 24 may be a layer of BPSG, PSG, BSG, silicon dioxide, silicon nitride, polyimide, or other well-known light transmissive insulator. The metallization layers and associated dielectric layers, which are part of protective layer 24, may be formed of any convention material known in the art.

Since a large portion of the reflected IR radiation originates from the difference in the index of refraction between the silicon substrate and the air (or epoxy layer) under the die, the imager 20 further comprises an anti-reflective layer 80 formed on a second surface 32 of the substrate 30. As set forth below, the anti-reflective layer 80 can be formed from any suitable material as understood by those having ordinary skill in the art. An absorption layer 82 is formed on the anti-reflective layer 80. The absorption layer 82 may be formed of any suitable material that absorbs IR radiation at the wavelength of between about 800 to about 1150 nm. Moreover, it should be understood that the present invention also reduces image artifacts from IR radiation through the backside of the substrate 30. While FIG. 2 shows both an anti-reflective layer 80 and an absorption layer 82, it should be understood that the device can be fabricated with only the absorption layer 82.

The problem of reflected IR radiation is increased when the thickness of the substrate 30 is reduced. For example, the quantity of photons with wavelength of 1000 nm reaching dark pixels due to the reflection from backside of the wafer in a 670 μm thick substrate, results in the accumulation of 3 electrons in the dark pixels from an original expose of the imager 20 to 100,000 photons. This accumulation will result in a change of 1 Lowest Significant Beat (LSB) in the dark signal. In comparison, for a 100 μm thick substrate 30 the quantity of photons reflecting and reaching the dark pixel increases to more than 473 electrons accumulating in the dark pixels resulting in dark signal change of 142 LSB.

Any anti-reflective layer 80 can be used in the imager 20. The anti-reflective layer 80 should be designed to effectively reduce internal reflection of photons from the backside of the substrate 30. A person having ordinary skill in the art would understand the types of materials used for the anti-reflective layer 80. Examples of suitable materials for the anti-reflective layer 80 include the various antireflective coatings that have been deposited on the surface 32 of the substrate 30. A deposited antireflective coating (DARC) is one example of a suitable anti-reflective layer 80. Deposited antireflective coatings will typically comprise silicon and nitrogen, and can, for instance, be comprised of silicon, nitrogen and optionally, hydrogen. DARC's can alternatively comprise silicon, oxygen, and in some cases, hydrogen. Other suitable materials for forming the anti-reflective layer 80 include a layered structure of titanium nitride and aluminum, such as a stacked layer of TiN/Al/TiN. Another suitable material for the anti-reflective layer 80 includes $TiO_2$. The thickness of the anti-reflective layer 80 should be large enough so as to preclude reflection of the IR photons coming through the substrate 30. Preferably, the anti-reflective layer 80 has a thickness from about 0.1 μm to about 5 μm, preferably from about 0.1 μm to about 2.5 μm, most preferably from about 0.1 μm to about 0.5 μm. Examples of anti-reflective materials which can be used are disclosed, in U.S. Pat. Nos. 6,887,648; 6,444,588; 6,713,404; 6,869,747; 6,767,689; 6,753,584; and 6,614,085, the disclosure of each of which are incorporated herein by reference. While the anti-reflective layer 80 is illustrated as a single layer, it should be understood that the anti-reflective layer can be formed from a plurality of layers that may be formed of the same or different materials.

An absorption layer 82 may be deposited over the anti-reflective layer 80. Absorption layer 82 absorbs IR radiation in the spectral range of from about 800 to about 1150 nm. Absorption layer 82 may be formed of one or more of many different materials that absorb IR radiation. Absorption layer 82 may be formed, for example, of germanium (Ge). However, other materials from which absorption layer 82 may be formed include SiGe, SiC, or the like. The thickness of the absorption layer 82 should be large enough so as to absorb all the IR photons coming through the substrate 30. Preferably, the absorption layer 82 has a thickness from about 0.5 μm to about 8 μm, preferably from about 1 μm to about 6 μm, most preferably from about 2 μm to about 5 μm. While the absorption layer 82 is illustrated as a single layer, it should be understood that the absorption layer 82 can be formed from a plurality of layers and may be formed by the same or different materials.

Figure 3:
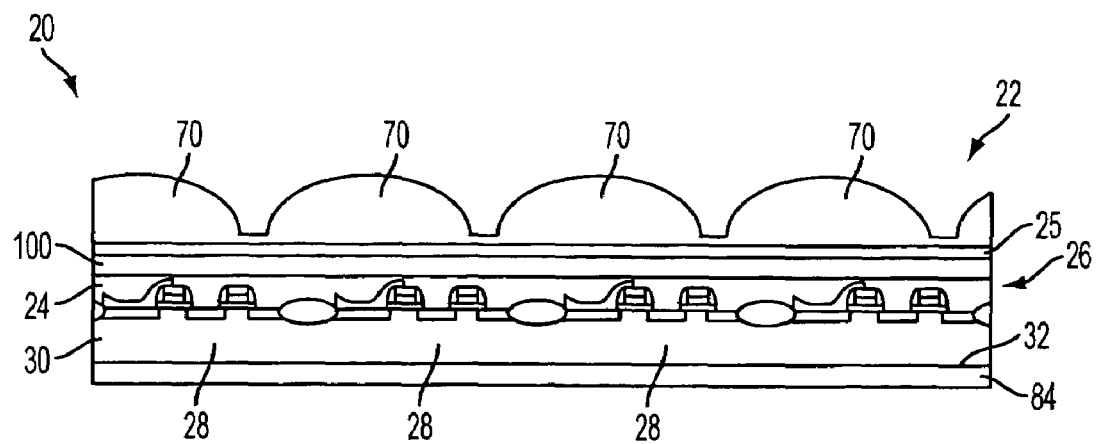
FIG. 3 is a side cross-sectional view illustrating the principal elements of a solid-state imager having an absorption layer n the backside of the substrate in accordance with an exemplary embodiment of the present invention.

Reference is now made to FIG. 3 which schematically illustrates a second embodiment of the solid-state imager 20 of the present invention. The illustrated FIG. 3 embodiment comprises a micro-lens array 70 formed over a color filter layer 100 and spacer layer 25, which are formed over a pixel cell array 26 formed in and/or over a first surface of substrate 30, which may be any of the types of substrate described above. The imager 20 further comprises an absorption layer 84 formed on a second surface 32 of the substrate 30. The absorption layer 84 may be formed of any suitable material which absorbs IR radiation at the wavelength of between about 800 to about 1150 nm. Preferably the absorption layer 84 is formed from Ge, SiGe, SiC, or the like. Most preferably, the absorption layer 84 is formed from germanium, as germanium for these purposes can be deposited on the surface of the substrate 30 using standard vacuum deposition techniques. While the absorption layer 84 is illustrated as a single layer, it should be understood that the absorption layer 84 can be formed from a plurality of layers and may be formed by the same or different materials.

As noted, in a most preferred embodiment the absorption layer 84 is formed of germanium (Ge). While not wishing to be bound by theory, it is believed that the internal reflection from the Si/Ge boundary from the substrate/absorption layer is less than 3%, which reduces the amount of reflected light by more than 10 times for an imager and more than 20 times for a package/module design. By depositing the absorption layer 84 on the second surface 32 of the substrate 30, it is believed that the resulting quantity of accumulated charge for a 100-μm thick substrate will not exceed 44 e with a corresponding change of dark signal of not more than 13LSB at highest gain.

Figure 4:
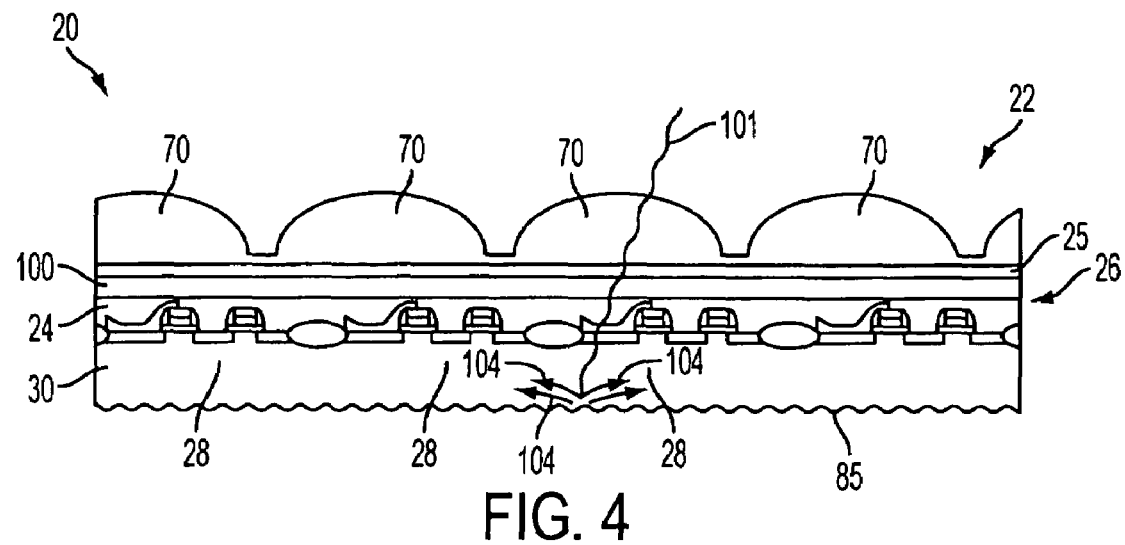
FIG. 4 is a side cross-sectional view illustrating the principal elements of a solid-state imager having an abraded backside of the substrate in accordance with an exemplary embodiment of the present invention.

Reference is now made to FIG. 4, which schematically illustrates a third embodiment of the solid-state imager 20 of the present invention. The illustrated embodiment comprises an imaging device having a micro-lens array 70 formed over a color filter layer 100 and spacer layer 25, which are formed over a pixel cell array 26 formed in and/or over a first surface of substrate 30. The imager 20 further comprises a roughened second substrate surface 85.

Figure 5A:
FIG. 5A is an image taken with an imaging device having a polished backside surface according to the prior art.
Figure 5B:
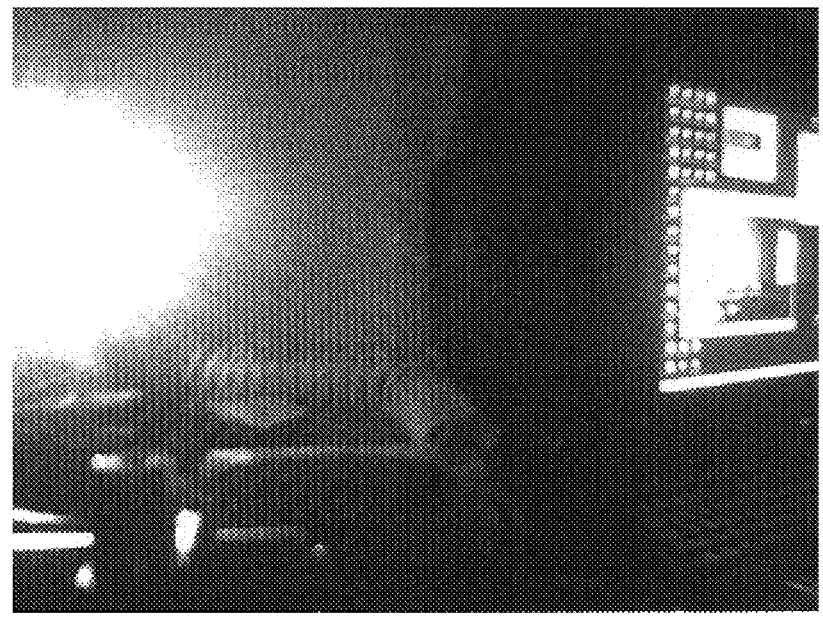
FIG. 5B is an image taken with an imaging device having a roughened backside surface according to the present invention.

Roughening of the second substrate surface 85 in the perpendicular direction with respect to the second surface 32 provides the scattering of IR radiation instead of direct reflection to the dark pixels. Thus, the quantity of photons 101 hitting dark pixels can be reduced by scattering the photons 104 away from the dark pixels. FIG. 5 illustrates experimental results showing reducing of image artifacts from bright halogen lamp (row banding) with a roughened second surface 85 of the substrate 30. FIG. 5A is an image taken with an imaging device having a polished backside surface. FIG. 5B is an image taken with an imaging device having a roughened backside surface according to the present invention.

The roughened second surface 85 may be formed in the substrate 30 by known methods such as, for example, chemical mechanical polishing techniques. In a typical chemical mechanical planarization (CMP) process, the substrate surface that is being polished is placed into contact with a rotating polishing pad. During the polishing process, the pad is rotated while a downward force is maintained against the substrate. A polishing composition is applied to the interface between the polishing pad and the substrate surface being polished. The polishing composition can be applied to the interface by applying the polishing composition to the polishing pad surface, to the substrate surface being polished, or both. The polishing composition can be applied to the interface either intermittently or continuously and the application of the polishing composition can begin prior to or after the polishing pad is brought into contact with the substrate surface being polished.

The polishing process further requires an abrasive material to assist in removing a portion of the substrate surface to form the roughened second surface 84. The abrasive may be incorporated into the polishing pad such as polishing pads disclosed in U.S. Pat. No. 6,121,143, which is incorporated herein by reference, it may be incorporated into the polishing composition, or both. Ingredients in the polishing composition or slurry initiate the polishing process by chemically reacting with the material on the surface of the substrate that is being polished. The polishing process is facilitated by the movement of the pad relative to the substrate as the chemically reactive polishing composition or slurry is provided to the substrate/pad interface. Polishing is continued in this manner until the desired roughness of the roughened second surface 85 is achieved.

The movement of the polishing pad in relationship to the substrate can vary depending upon the desired polishing end results for the roughened second surface 85. Often, the polishing pad substrate is rotated while the surface of the substrate being polished remains stationary. Alternatively, the polishing pad and the substrate being polished can both move with respect to one another. The polishing substrates and in particular the polishing pads of this invention can be moved in a linear manner, they can move in a orbital or a rotational manner or they can move in a combination of the directions.

The polishing composition is formulated to include chemicals that react with and soften the surface of the material being polished. The choice of polishing composition or slurry is an important factor in the CMP step. Depending on the choice of ingredients such as oxidizing agents, acids, bases, surfactants, complexing agents, abrasives, and other useful additives, the polishing slurry can be tailored to provide effective polishing of the substrate layer(s) at desired polishing rates. Furthermore, the polishing composition may be selected to provide controlled polishing selectivities to the surface.

Examples of CMP polishing compositions and slurries are disclosed, in U.S. Pat. Nos. 6,068,787; 6,063,306; 6,033,596; 6,039,891; 6,015,506; 5,954,997; 5,993,686; 5,783,489; 5,244,523; 5,209,816; 5,340,370; 4,789,648; 5,391,258; 5,476,606; 5,527,423; 5,354,490; 5,157,876; 5,137,544; and 4,956,313, the specifications of each of which are incorporated herein by reference.

Figure 6:
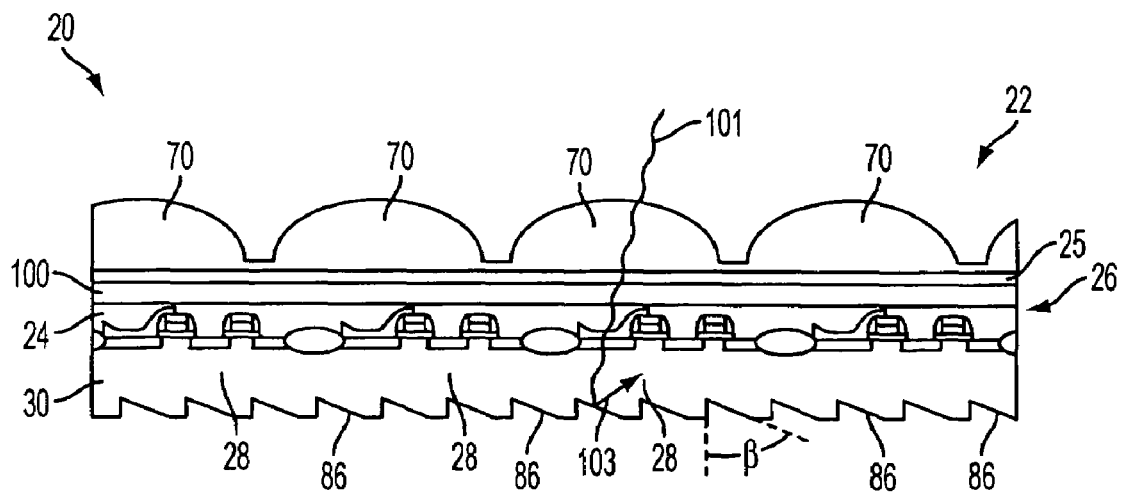
FIG. 6 is a side cross-sectional view illustrating the principal elements of a solid-state imager having an abraded backside of the substrate in accordance with an exemplary embodiment of the present invention.

Reference is now made to FIG. 6, which schematically illustrates a fourth embodiment of the solid-state imager 20 of the present invention. As set forth above with reference to FIGS. 2-4, the illustrated embodiment comprises an imaging device having a micro-lens array 70 formed over a color filter layer 100 and spacer layer 25, which are formed over a pixel cell array 26 formed in and/or over a first surface of substrate 30. The imager 20 further comprises at least one shaped grating 86 formed on a second surface of the substrate 30. FIG. 6 illustrates several shaped gratings 86. The shaped gratings 86 are preferably aligned at an angle β to a second surface 32 of the substrate 30. The shaped gratings 86 reduce the amount of IR photons accumulating in the dark pixels by the angles and orientation of the shaped gratings which are selected to reflect the photons away from the dark pixels.

The shaped gratings 86 can be formed by any chemical or mechanical methods know in the art, such as, for example, chemical mechanical polishing as described above. As discussed above, the polishing is selected to provide controlled polishing selectivities to the surface so as to form the shaped gratings 86 at the desired angle to reflect the IR radiation away from the dark pixels. The shaped gratings 86 are preferably aligned at an angle β to a second surface 32 of the substrate 30 where the angle β is preferably from about 10 to about 75 degrees, more preferably from about 20 to about 55 degrees, more preferably from about 35 to about 45 degrees. Thus, the photons 101 that penetrate the substrate 30 reflect back 103 away from dark pixels. The shaped gratings 86 thus reduce accumulation of photons in the dark pixels.

Figure 7:
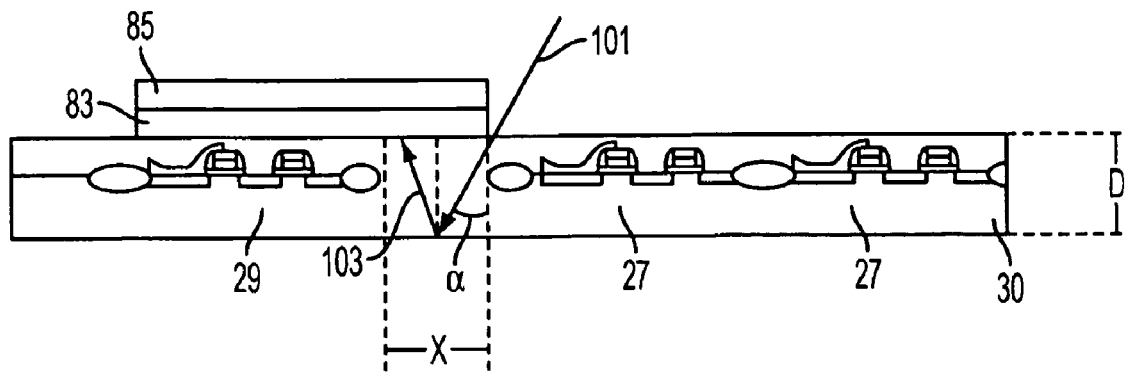
FIG. 7 is a side cross-sectional view illustrating the principal elements of a solid-state imager having the dark pixel separated from the active pixel in accordance with an exemplary embodiment of the present invention.

Reference is now made to FIG. 7, which schematically illustrates a fifth embodiment of the solid-state imager 20 of the present invention. According to the present invention, it has been found that providing a spacing X between active pixel array 27 and dark pixels 29 in an imager 20 can reduce the amount of IR radiation that contacts the dark pixels 29. The space X between active pixel array 27 and dark pixels 29 is preferably covered by an absorption layer 83 and a non-transparent layer 85. The absorption layer 83 may be formed, for example, Ge, SiGe, SiC, or the like. The thickness of the absorption layer 83 should be thick enough to absorb the reflected radiation 103 and preferably has a thickness from about 0.5 μm to about 8 μm, preferably from about 1 μm to about 6 μm, most preferably from about 2 μm to about 5 μm. The non-transparent layer 85 may be any suitable non-transparent material to prevent penetration of radiation 101 into the substrate, such as, for example metals such as tungsten, aluminum or the like. The absorption layer 83 and a non-transparent layer 85 prevent penetration of light and IR radiation into the substrate. The absorption layer 83 further prevents subsequent reflection of IR photons back to the substrate and into the dark pixel 29. The width of the space X between the active pixel array 27 and dark pixels 29 in imager can be calculated by the following:

$$X = 2 \cdot D \cdot \tan(\alpha)$$

where D is the thickness of the wafer and α is the maximum angle of ray for the IR radiation in the substrate.

Figure 8:
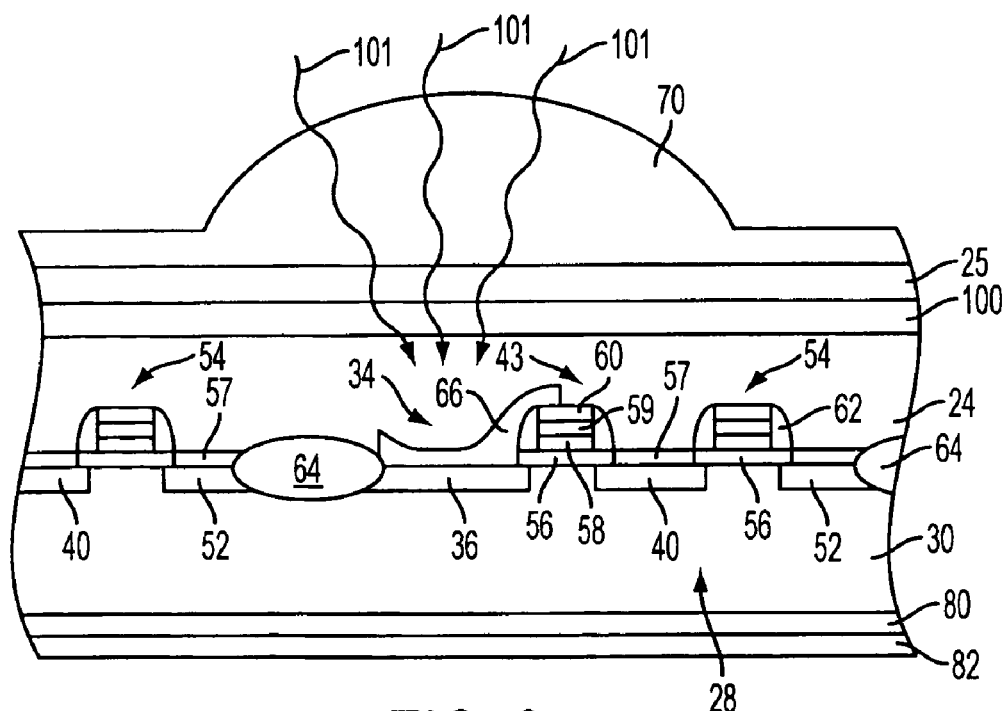
FIG. 8 illustrates a schematic cross-sectional view of a CMOS imager pixel cell having a color filter array constructed in accordance with an exemplary embodiment of the present invention.

Reference is now made to FIGS. 8-17. FIG. 8 shows an expanded view of the solid-state imager discussed above. The pixel array 26 shown in FIGS. 2-4 and 6-7 comprises a plurality of pixel sensor cells 28 formed in and over the substrate 30, and is covered by a protective layer 24 that acts as a passivation, planarization and metallization layer for the imager 20. Layer 24 may include one or more passivation layer and metallization layer. The passivation portion of the protective layer 24 may be a layer of BPSG, PSG, BSG, silicon dioxide, silicon nitride, polyimide, or other well-known light transmissive insulator.

The color filter layer 100 is formed over the protective layer 24. The color filter layer 100 comprises an array of red, blue and green sensitive elements, which may be arranged in a pattern understood by the person having ordinary skill in the art as exemplified by U.S. Pat. Nos. 6,783,900 and 3,971,065, which are herein incorporated by reference.

Figure 9:
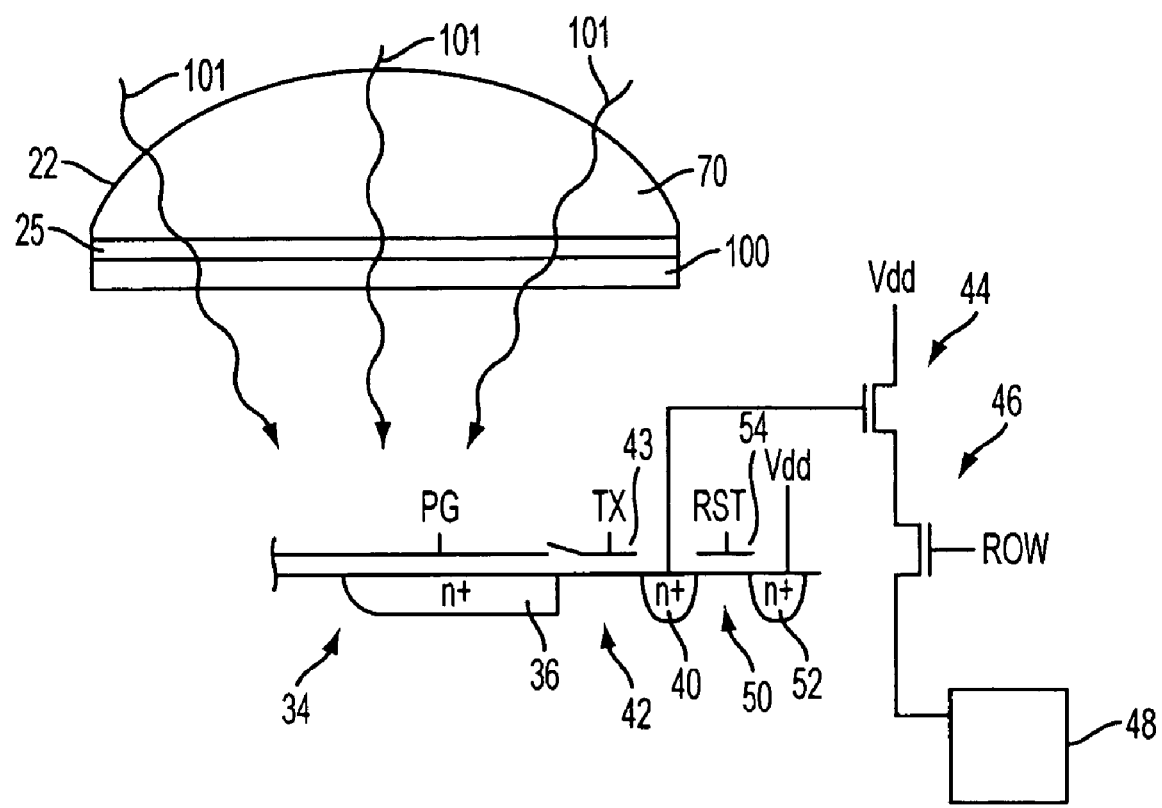
FIG. 9 is a representative diagram of the CMOS imager pixel cell of FIG. 8.

As shown in FIGS. 8-9, each pixel sensor cell contains a photosensor 34, which may be a photodiode, photogate, or the like. A photogate photosensor 34 is depicted in FIGS. 8-9. A control signal PG is applied to the photogate 34 so that when radiation 101 in the form of photons passes color filter layer 100 and strikes the photosensor 34, the photo-generated electrons accumulate in the doped region 36 under the photosensor 34. A transfer transistor 42 is located next to the photosensor 34, and has source and drain regions 36, 40 and a gate stack 43 controlled by a transfer signal TX. The drain region 40 is also called a floating diffusion region, and it passes charge received from the photosensor 34 to output transistors 44, 46 and then to readout circuitry 48. A reset transistor 50 comprised of doped regions 40, 52 and gate stack 54 is controlled by a reset signal RST which operates to reset the floating diffusion region 40 to a predetermined initial voltage just prior to signal readout. Details of the formation and function of the above-described elements of a pixel sensor cell may be found, for example, in U.S. Pat. Nos. 6,376,868 and 6,333,205, the disclosures of which are incorporated by reference herein.

As illustrated in FIG. 8, the gate stacks 43, 54 for the transfer 42 and reset 50 transistors include a silicon dioxide or silicon nitride insulator 56 on the substrate 30, which in this example is a p-type substrate, a conductive layer 58 of doped polysilicon, tungsten, or other suitable material over the insulating layer 56, and an insulating cap layer 60 of, for example, silicon dioxide, silicon nitride, or ONO (oxide-nitride-oxide). A silicide layer 59 may be used between the polysilicon layer 58 and the cap 60, if desired. Insulating sidewalls 62 are also formed on the sides of the gate stacks 42, 54. These sidewalls 62 may be formed of, for example, silicon dioxide, silicon nitride, or ONO. A field oxide layer 64 around the pixel sensor cell 28 serves to isolate it from other pixel cells in the array. A second gate oxide layer 57 may be grown on the silicon substrate 30 and the photogate semi-transparent conductor 66 is patterned from this layer. In the case that the photosensor is a photodiode, the second gate oxide layer 57 and the photogate semi-transparent conductor 66 are not required. Furthermore, transfer transistor 42 is optional, in which case the diffusion regions 36 and 40 are connected together.

The image devices 20 described above with reference to FIGS. 2-4 and 6-7 are manufactured through a process described as follows, and illustrated in FIGS. 10-17.

Figure 10:
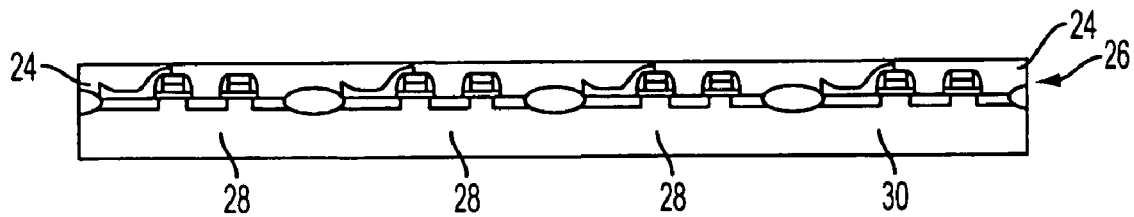
FIG. 10 illustrates a cross-sectional view of a semiconductor wafer undergoing the process of forming an imager device according to an exemplary embodiment of the present invention.

Referring now to FIG. 10, a substrate 30, which may be any of the types of substrates described above, having a pixel cell array 26, peripheral circuits, contacts and wiring formed thereon by well-known methods, is provided. A protective layer 24 of BPSG, BSG, PSG, silicon dioxide, silicon nitride or the like is formed over the pixel cell array 26 to passivate it and to provide a planarized surface.

Figure 11:
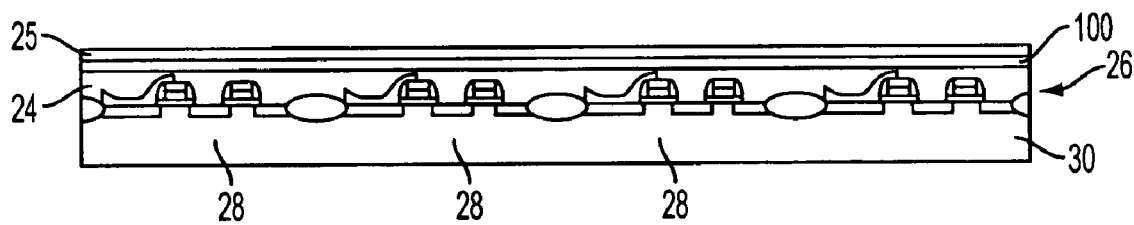
FIG. 11 illustrates the semiconductor wafer of FIG. 10 at a stage of processing subsequent to that shown in FIG. 10.

A color filter layer 100 is formed over the protective layer 24, as also shown in FIG. 11. The color filter layer 100 may be formed of a color resist or acrylic material which is used as a light transmitting material. For example, color filter layer 100 may be formed of a plurality of color filter layers, each of the plurality of color filter layers consisting of red filter regions (not shown), green filter regions (not shown) and blue filter regions (not shown), which are formed, for example, from resist or acrylic material of the respective color-filtering qualities. As such, red sensitive resist material, blue sensitive resist material and green sensitive resist material may be employed to form the red, blue and green sensitive elements of each of the plurality of color filter layers that form color filter layer 100. These red, blue and green elements may be formed in any pattern know to those skilled in the art. Other embodiments may employ other colored materials, such as paint or dye, as known in the art. The color filter layer 100 may be formed over the protective layer 24 by conventional deposition or spin-on methods, for example.

Figure 12:
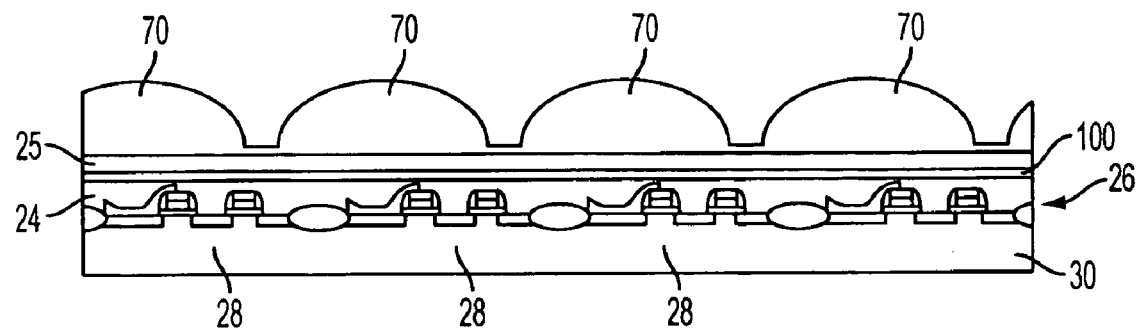
FIG. 12 illustrates the semiconductor wafer of FIG. 10 at a stage of processing subsequent to that shown in FIG. 11.

A spacing layer 25 is formed over the color filter layer 100, as illustrated in FIG. 11. Lenses 70 may then be formed, as shown in FIG. 12, from a lens forming layer, for example, so that each lens 70 overlies a pixel cell 28. Alternative constructions in which a lens 70 overlies multiple pixel cells 28 are also encompassed by the present invention. It should also be understood that the preceding examples discuss one embodiment of the present invention. Of course, it should be understood that other embodiments of the invention may be similarly fabricated as discussed with reference to FIGS. 2-4 and 6-7.

While the processes have been described with reference to a CMOS imager device, it should be understood that the process may be also used with pixel cells of other types of imagers as well, for example, with a CCD imager. Accordingly, the pixel cell formed as described above may be employed in CCD image sensors as well as CMOS image sensors. The imager devices of the present invention may also be formed as different size megapixel imagers, for example imagers having arrays in the range of about 0.1 megapixels to about 20 megapixels.

Figure 13:
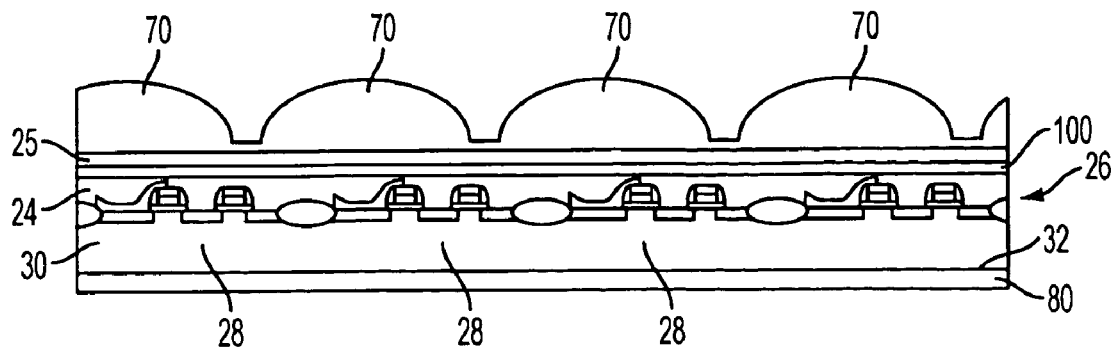
FIG. 13 illustrates the semiconductor wafer of FIG. 10 at a stage of processing subsequent to that shown in FIG. 12.

An anti-reflective layer 80 is formed on the second surface 32 of the substrate 30, as illustrated in FIG. 13. The anti-reflective layer 80 is designed to reduce internal reflection of photons from the backside 32 of the substrate 30. Examples of suitable materials for the anti-reflective layer 80 include the various antireflective coatings such as, for example, a deposited antireflective coating (DARC). Deposited antireflective coatings will typically comprise silicon and nitrogen, and can, for instance, be comprised of silicon, nitrogen and optionally, hydrogen. DARC's can alternatively comprise silicon, oxygen, and in some cases, hydrogen. Other suitable materials for forming the anti-reflective layer 80 include a layered structure of titanium nitride and aluminum, such as a stacked layer of TiN/Al/TiN. Another suitable material for the anti-reflective layer 80 includes $TiO_2$. The thickness of the anti-reflective layer 80 should be large enough so as to preclude reflection of the IR photons coming through the substrate 30. Preferably, the anti-reflective layer 80 has a thickness from about 0.1 µm to about 5 µm, preferably from about 0.1 µm to about 2.5 µm, most preferably from about 0.1 µm to about 0.5 µm.

Figure 14:
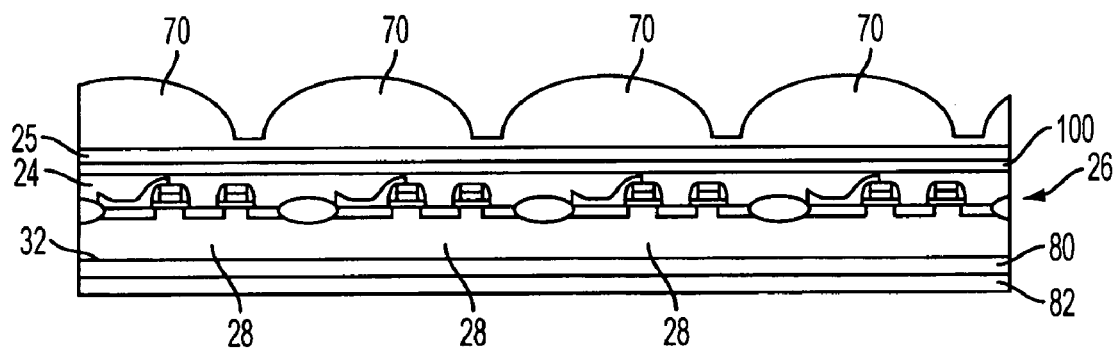
FIG. 14 illustrates the semiconductor wafer of FIG. 10 at a stage of processing subsequent to that shown in FIG. 13.

An absorption layer 82 is formed on the anti-reflective layer 80, as illustrated in FIG. 14. The absorption layer 82 may be formed of one or more of many different materials which absorb IR radiation, such as, for example, Ge, SiGe, SiC, or the like. The thickness of the absorption layer 82 should be large enough so as to absorb all the IR photons coming through the substrate 30. Preferably, the absorption layer 82 has a thickness from about 0.5 µm to about 8 µm, preferably from about 1 µm to about 6 µm, most preferably from about 2 µm to about 5 µm.

Figure 15:
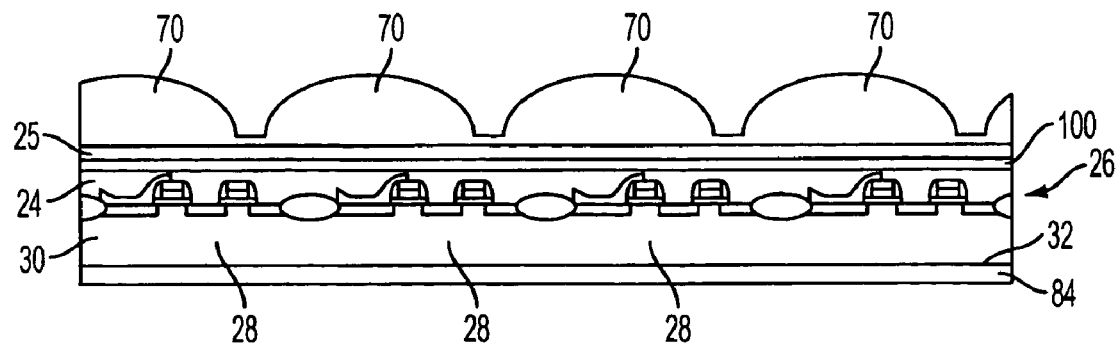
FIG. 15 illustrates the semiconductor wafer of FIG. 10 at a stage of processing subsequent to that shown in FIG. 12 in accordance with another embodiment of the invention.

FIG. 15 illustrates an imager according to a second embodiment of the present invention at a processing stage subsequent to the processing stage illustrated in FIG. 12. An absorption layer 84 is formed on a second surface 32 of the substrate 30. The absorption layer 84 may be formed of any suitable material which absorbs IR radiation at the wavelength of between about 800 to about 1150 nm. Preferably the absorption layer 84 is formed from Ge, SiGe, SiC, or the like. Most preferably, the absorption layer 84 is formed from germanium, as germanium for these purposes can be deposited on the surface of the substrate 30 using the standard vacuum deposition techniques. Preferably, the absorption layer 84 has a thickness from about 0.5 µm to about 8 µm, preferably from about 0.5 µm to about 3.5 µm.

Figure 16:
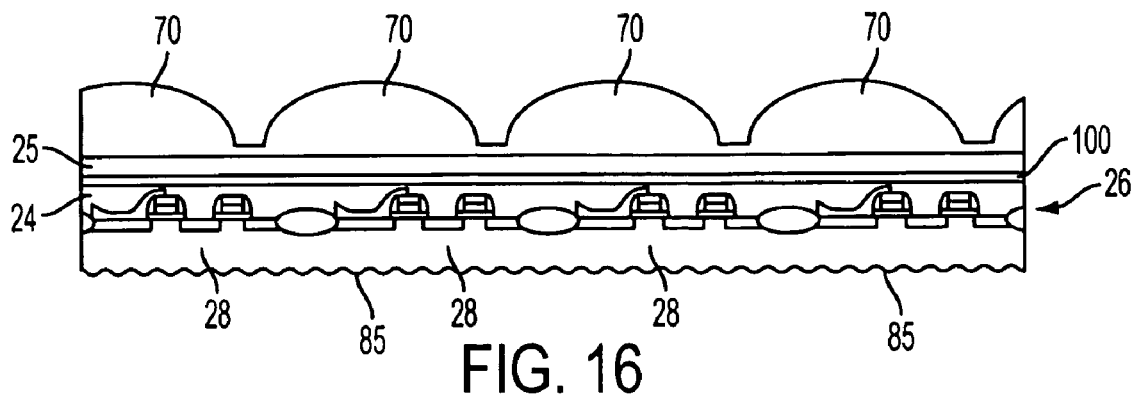
FIG. 16 illustrates the semiconductor wafer of FIG. 10 at a stage of processing subsequent to that shown in FIG. 12 in accordance with another embodiment of the invention.

FIG. 16 illustrates an imager according to a third embodiment of the present invention at a processing stage subsequent to the processing stage illustrated in FIG. 12. The second surface 32 of the substrate is roughened to form a roughened second surface 85. The roughened second surface 85 is formed by known methods such as, for example, chemical mechanical polishing techniques. In a typical chemical mechanical planarization (CMP) process, the substrate surface that is being polished is placed into contact with a rotating polishing pad. A polishing composition is applied to the interface between the polishing pad and the substrate surface being polished. An abrasive material may be added to assist in removing a portion of the substrate surface to form the roughened second surface 85. The polishing process is facilitated by the movement of the pad relative to the substrate as the chemically reactive polishing composition or slurry is provided to the substrate/pad interface. Polishing is continued in this manner until the desired roughness of the roughened second surface 85 is achieved.

Figure 17:
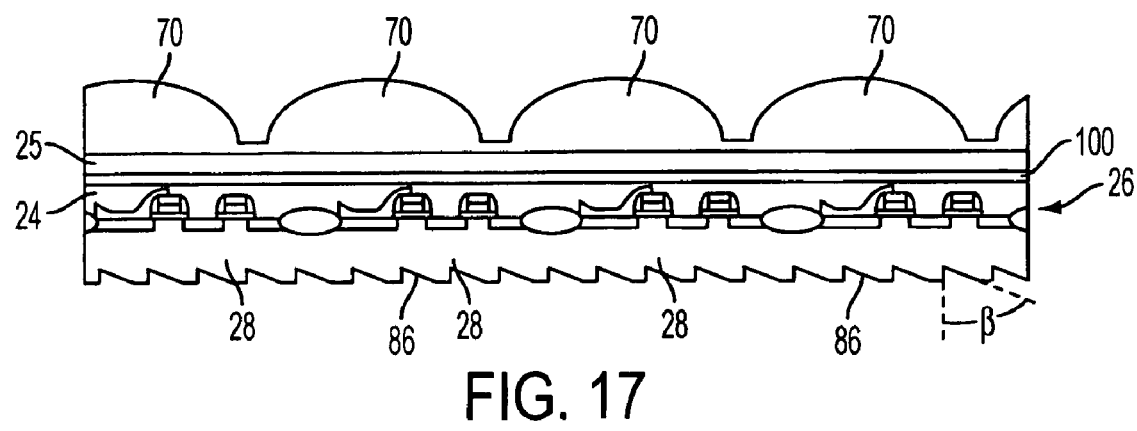
FIG. 17 illustrates the semiconductor wafer of FIG. 10 at a stage of processing subsequent to that shown in FIG. 12 in accordance with another embodiment of the invention.

FIG. 17 illustrates an imager according to a fourth embodiment of the present invention at a processing stage subsequent to the processing stage illustrated in FIG. 12. The imager 20 further comprises at least one shaped grating 86 formed on a second surface 32 of the substrate 30. FIG. 17 illustrates several gratings 86. The shaped gratings 86 are preferably aligned at an angle β to a second surface 32 of the substrate 30. The shaped gratings 86 reduce the amount of IR photons accumulating in the dark pixels by reflecting the photons away from the dark pixels.

The shaped gratings 86 can be formed by any chemical or mechanical methods know in the art, such as, for example, chemical mechanical polishing as described above. As discussed above, the polishing is selected to provide controlled polishing selectivities to the surface so as to form the shaped gratings 86 at the desired angle to reflect the IR radiation away from the dark pixels. The shaped gratings 86 are preferably aligned at an angle β to a second surface 32 of the substrate 30 where the angle β is preferably from about 10 to about 75 degrees, more preferably from about 20 to about 55 degrees, more preferably from about 35 to about 45 degrees.

Figure 18:
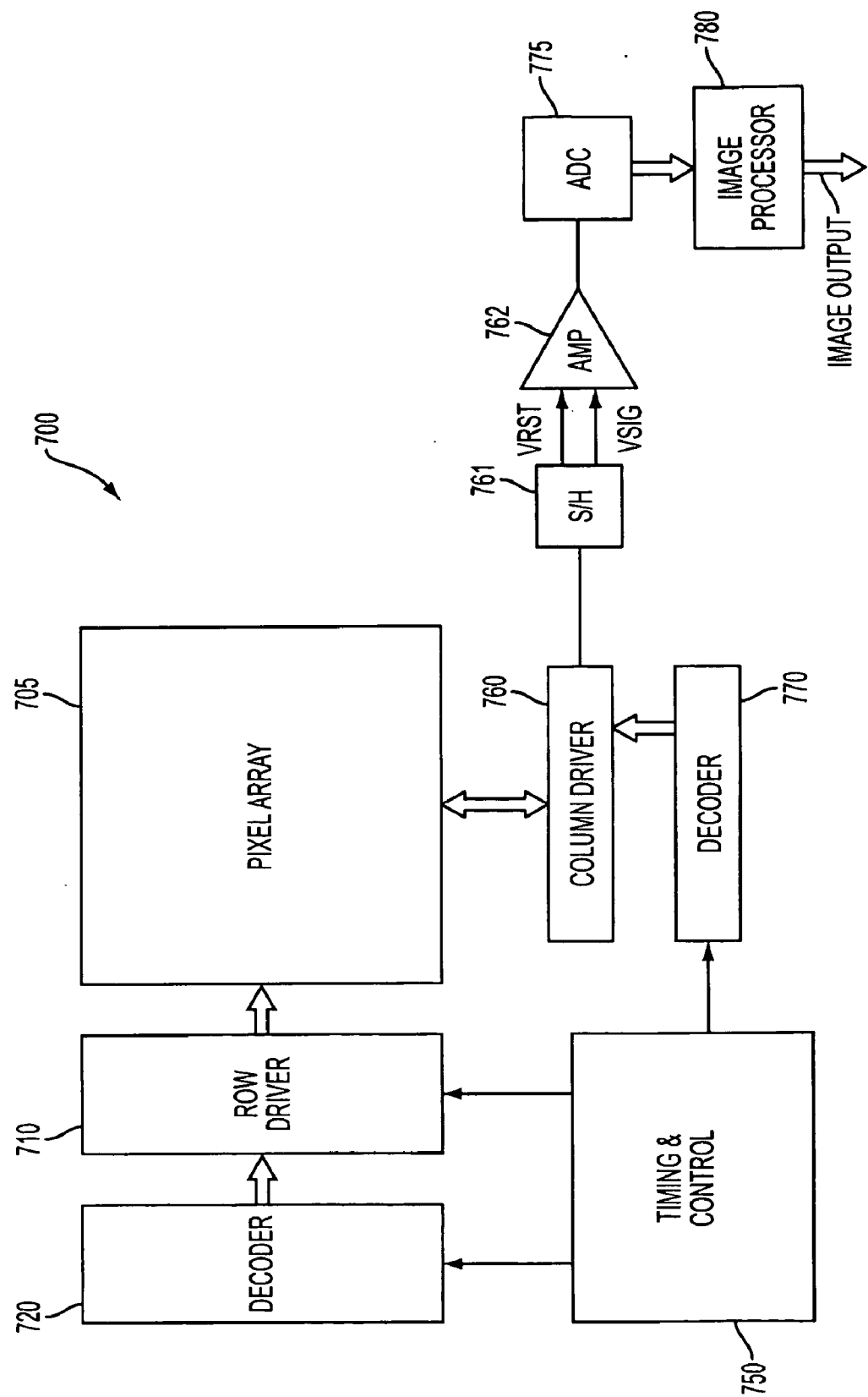
FIG. 18 shows an imager constructed in accordance with an embodiment of the invention.

FIG. 18 illustrates an exemplary imager 700 that may utilize any embodiment of the invention. The imager 700 has a pixel array 705 comprising pixels constructed as described above with respect to FIGS. 2-4 and 5-17. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst-Vsig) is amplified by differential amplifier 762 for each pixel and is digitized by analog-to-digital converter 775 (ADC). The analog-to-digital converter 775 supplies the digitized pixel signals to an image processor 780 which forms a digital image.

Figure 19:
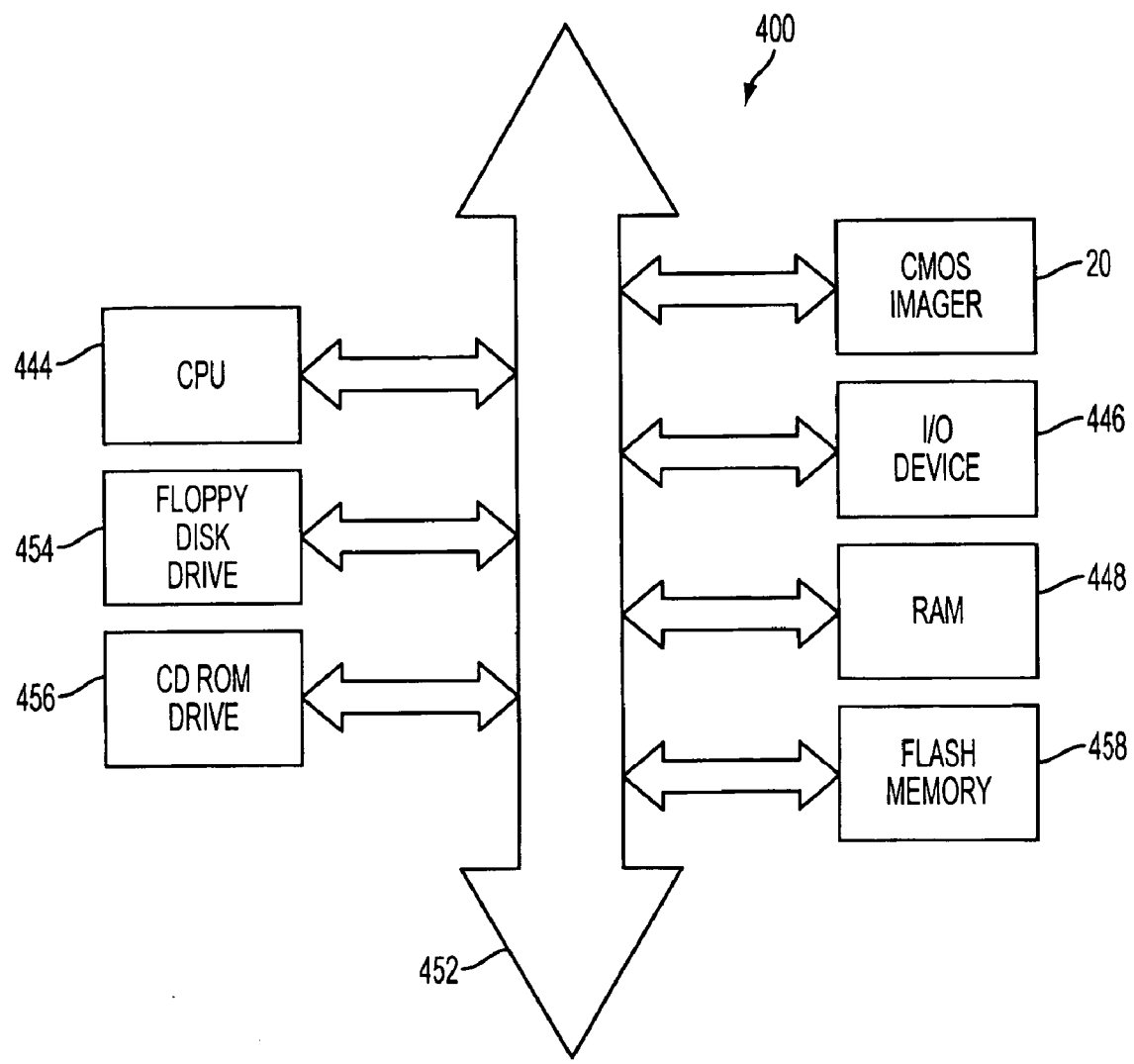
FIG. 19 is an illustration of an imaging system having an imager with reduced image artifacts according to an exemplary embodiment of the present invention.

If desired, the imager 20 may be combined with a processor, such as a CPU, digital signal processor or microprocessor. The imager 20 and the microprocessor may be formed in a single integrated circuit. An exemplary processor system 400 using a CMOS imager having a filter array in accordance with the present invention is illustrated in FIG. 19. A processor based system is exemplary of a system having digital circuits which could include CMOS or other imager devices. Without being limiting, such a system could include a computer system, camera system, scanner, machine vision system, vehicle navigation system, video telephone, surveillance system, auto focus system, star tracker system, motion detection system, image stabilization system and other image processing systems.

As shown in FIG. 19, an exemplary processor system 400, for example, a camera generally comprises a central processing unit (CPU) 444, e.g., a microprocessor, that communicates with an input/output (I/O) device 446 over a bus 452. The imager 20 also communicates with the system over bus 452. The computer system 400 also includes random access memory (RAM) 448, and may include peripheral devices such as a floppy disk drive 454, a compact disk (CD) ROM drive 456 or a flash memory 458 which also communicate with CPU 444 over the bus 452. The floppy disk 454, the CD ROM 456 or flash memory 458 stores images captured by imager 20. The imager 20 is preferably constructed as an integrated circuit, with or without memory storage, as previously described with respect to FIGS. 2-4 and 5-17.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An imager comprising:
    a semiconductor substrate having a first surface and a second surface; and
    an array of pixel sensor cells comprising a plurality of pixel cells formed at a first surface of the substrate, said pixel cells including imaging pixel cells and dark current pixel cells;
    wherein said second surface has surface abrasions formed therein for reducing the amount of light reflecting from said second surface back to said dark current pixel cells.

2. The imager according to claim 1, wherein said surface abrasions include perpendicular roughenings.

3. An imager comprising:
    a semiconductor substrate having a first surface and a second surface; and
    an array of pixel sensor cells comprising a plurality of pixel cells formed at a first surface of the substrate, said pixel cells including imaging pixel cells and dark current pixel cells;
    wherein said second surface has surface abrasions that include shaped gratings formed therein for reducing the amount of light reflecting from said second surface back to said dark current pixel cells.

4. The imager according to claim 3, wherein said shaped gratings are formed at an angle of from about 10 to about 75 degrees to said second surface.

5. The imager according to claim 3, wherein said shaped gratings are formed at an angle of from about 20 to about 55 degrees to said second surface.

6. An imager comprising:
    an array of pixel sensor cells comprising a plurality of active pixel cells and dark current pixel cells formed at a first surface of a substrate, wherein said active pixel cells and said dark current pixel cells are separated in said substrate by a predetermined distance, wherein the predetermined distance is such that an amount of light reflecting from a second surface of the substrate back to said dark current pixel cells is reduced.

7. The imager according to claim 6, wherein said predetermined distance is calculated by the following formula:

$$2 \cdot D \cdot \tan(\alpha)$$

where D is the thickness of said substrate and $\alpha$ is the maximum angle of the infrared radiation into said substrate.

8. The imager according to claim 7, further comprising an absorption layer formed over said dark current pixel cells and said separation distance.

9. The imager according to claim 8, wherein said absorption layer is formed from materials selected from the group consisting of Ge, SiGe, and SiC.

10. The imager according to claim 8, further comprising a non-transparent layer formed over said absorption layer.

11. The imager according to claim 10, wherein said non-transparent layer is formed from a metal.

12. The imager according to claim 11, wherein said metal is selected from the group consisting of tungsten and aluminum.

* * * * *

UNITED STATES PATENT AND TRADEMARK OFFICE
CERTIFICATE OF CORRECTION

PATENT NO. : 7,576,361 B2  Page 1 of 1
APPLICATION NO. : 11/195687
DATED : August 18, 2009
INVENTOR(S) : Agranov et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 613 days.

Signed and Sealed this

Seventh Day of September, 2010

David J. Kappos
*Director of the United States Patent and Trademark Office*